United States Patent
Adamski et al.

(10) Patent No.: US 8,502,607 B2
(45) Date of Patent: *Aug. 6, 2013

(54) LEAKAGE CURRENT REDUCTION IN A POWER REGULATOR

(75) Inventors: Jaroslaw Adamski, Streamwood, IL (US); Daniel Losser, Grayslake, IL (US); Vikas Sharma, Elgin, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/008,711

(22) Filed: Jan. 18, 2011

(65) Prior Publication Data

US 2011/0110137 A1    May 12, 2011

Related U.S. Application Data

(62) Division of application No. 12/455,671, filed on Jun. 3, 2009, now Pat. No. 7,872,533.

(51) Int. Cl.
*H03F 3/04* (2006.01)

(52) U.S. Cl.
USPC .......................................... 330/297; 330/296

(58) Field of Classification Search
USPC .......................................... 330/297, 296, 285
See application file for complete search history.

(56) References Cited

U.S. PATENT DOCUMENTS

| | | | |
|---|---|---|---|
| 4,244,016 A * | 1/1981 | Mitchell | 363/98 |
| 4,528,517 A | 7/1985 | Schlotzhauer | |
| 5,331,221 A | 7/1994 | Ganesan et al. | |
| 7,202,712 B2 | 4/2007 | Athas | |
| 7,202,734 B1 | 4/2007 | Raab | |
| 7,248,120 B2 | 7/2007 | Burgener et al. | |
| 7,449,954 B2 * | 11/2008 | Bocock et al. | 330/285 |
| 7,457,594 B2 | 11/2008 | Theobold et al. | |
| 7,545,216 B2 | 6/2009 | Hamley | |
| 7,551,036 B2 | 6/2009 | Berroth et al. | |
| 7,593,702 B1 * | 9/2009 | Lie et al. | 455/127.2 |
| 7,679,433 B1 * | 3/2010 | Li | 330/10 |
| 7,786,807 B1 | 8/2010 | Li et al. | |
| 7,817,966 B2 | 10/2010 | Prikhodko et al. | |
| 7,868,683 B2 | 1/2011 | Ilkov | |
| 7,872,533 B2 | 1/2011 | Adamski et al. | |
| 7,961,052 B2 | 6/2011 | Bacon et al. | |
| 8,106,711 B2 | 1/2012 | Adamski et al. | |
| 8,111,104 B2 | 2/2012 | Ahadian et al. | |
| 8,131,251 B2 | 3/2012 | Burgener et al. | |
| 2012/0007679 A1 | 1/2012 | Burgener et al. | |
| 2012/0086512 A1 | 4/2012 | Sharma et al. | |

OTHER PUBLICATIONS

Choe, Henry, Notice of Allowance for related U.S. Appl. No. 12/455,671, 12 pgs.

(Continued)

*Primary Examiner* — Henry Choe
(74) *Attorney, Agent, or Firm* — Jaquez & Associates; Martin J. Jaquez, Esq.; Alessandro Steinfl, Esq.

(57) ABSTRACT

A regulator with decreased leakage and low loss for a power amplifier is described. Switching circuitry is used to connect the regulator input bias to a bias control voltage when the power amplifier is to be operated in an on condition or to a voltage generator when the power amplifier is to be operated in an off condition.

10 Claims, 5 Drawing Sheets

(56) References Cited

OTHER PUBLICATIONS

Adamski, et al., Comments on Examiner's Statement of Reasons for Allowance filed in the USPTO dated Dec. 3, 2010 for related U.S. Appl. No. 12/455,671, 2 pgs.

Nguyen, Hieu P., Office Action for related U.S. Appl. No. 12/657,727, 12 pgs.

Choe, Henry, Office Action for related U.S. Appl. No. 12/657,728, 4 pgs.

Nguyen, Hieu P., Notice of Allowance for related U.S. Appl. No. 12/590,839, 13 pgs.

Nguyen, Hieu P., Notice of Allowance for related U.S. Appl. No. 12/657,727, 14 pgs.

Tran, Pablo N., Notice of Allowance for related U.S. Appl. No. 11/501,125, 11 pgs.

Choe, Henry, Notice of Allowance for related U.S. Appl. No. 12/799,910, 23 pgs.

Nguyen, Khanh V., Office Action for related U.S. Appl. No. 12/807,365, 14 pgs.

Nguyen, Khanh V., Office Action received from the USPTO dated Apr. 5, 2012 for related U.S. Appl. No. 12/807,365, 10 pgs.

Tran, Pablo, Office Action received from the USPTO dated Feb. 3, 2012 for related U.S. Appl. No. 12/903,848, 46 pgs.

Burgener, et al., Response filed in the USPTO dated 8/3/21 for related U.S. Appl. No. 12/903,848, 5 pgs.

Tran, Pablo, Notice of Allowance received from the USPTO dated Oct. 26, 2012 for related U.S. Appl. No. 12/903,848, 14 pgs.

Nguyen, Khanh, Notice of Allowance received from the USPTO dated Sep. 6, 2012 for related U.S. Appl. No. 12/807,365, 13 pgs.

Choe, Henry, Notice of Allowance received from the USPTO dated Nov. 1, 2012 for related U.S. Appl. No. 12/657,728, 10 pgs.

Sharma, et al., Issue Fee Transmittal and Comments on Examiner's Statement of Reasons for Allowance filed in the PTO on Dec. 27, 2012 for related U.S. Appl. No. 12/924,907, 4 pgs.

Tran, Pablo N., Notice of Allowance received from USPTO dated May 16, 2013 for related U.S. Appl. No. 12/903,848, 101 pgs.

Burgener, et al., Amendment filed in USPTO dated May 20, 2013 for related U.S. Appl. No. 13/412,463, 6 pgs.

Tran, Pablo N., Notice of Allowance received from USPTO dated Jun. 6, 2013 for related U.S. Appl. No. 13/412,463, 142 pgs.

\* cited by examiner

LEAKAGE CURRENT REDUCTION IN A POWER REGULATOR

CROSS REFERENCE TO RELATED APPLICATIONS

Claim of Priority

This application is a divisional application of U.S. application Ser. No. 12/455,671, "Leakage Current Reduction in a Power Regulator", filed Jun. 3, 2009, issuing Jan. 18, 2011 as U.S. Pat. No. 7,872,533, and this divisional application claims the benefit of priority to the referenced co-pending Ser. No. 12/455,671 application under 35 USC §§120 and 121, and the contents of the referenced Ser. No. 12/455,671 application to which priority is claimed is hereby incorporated by reference herein in its entirety.

BACKGROUND

1. Field

The present teachings relate to power regulators. More particularly, the present teachings relates to leakage current reduction methods and apparatus in a power regulator.

2. Description of Related Art

Mobile communication devices such as mobile telephones are generally powered by batteries. Therefore, it is desirable to improve the time before the battery charge is depleted. One method of improving battery life is to reduce the unintended current leakage from power supply to electrical ground or other reference voltage in the radio. By reducing this wasted current, the useful time of the battery is increased. Integrated circuit power amplifiers often have a regulator function that adjusts the output power of the amplifier. In order to further conserve power, these power amplifiers are turned off when the radio is not transmitting.

When a power amplifier is operated in an OFF state, the regulator shuts off the power to the amplifier and it is desirable to shut off the current flow through the regulator to as close to zero current as possible. Conversely, when it is operated in an ON state, it is desirable for the regulator to have as little loss or voltage drop as possible to maximize power efficiency of the system.

An optimal regulator will therefore have very low leakage when OFF and very low loss when ON. One way to achieve low loss in the ON state is to use MOS transistors having low threshold voltage. When transistors with low threshold voltage are used, the "on" resistance of those transistors is decreased when they are operated in the ON state as compared to transistors having higher threshold voltage.

However, when MOS transistors of low threshold voltage are used in a regulator, and they are operated in the OFF state, they may have higher leakage current from source to drain because they are still in subthreshold operation when the gate to source voltage Vgs is equal to zero. Transistors with higher threshold voltage generally have lower leakage in the OFF state than transistors of lower threshold voltage.

As a mitigation effort to reduce leakage from source to drain in the regulator transistors, an increase in the drawn channel length may be attempted. However, increasing the channel length of the regulator transistors has only a weak effect on the leakage current and has a significant reduction of efficiency due to increased "on" resistance. The need for a low-leakage, high-efficiency regulator circuit is clear.

FIG. 1 shows Vgs as a function of log(Ids) for a MOS transistor. In sub-threshold operation, the dependency of Vgs on log(Ids) is linear. Two different points P1 and P2 are taken on the sub-threshold portion of the curve, to define a $\Delta$Vgs and a $\Delta$ log Ids. A sub-threshold swing S can be defined as the reciprocal of the slope $\Delta$ log Ids/$\Delta$Vgs, i.e. S=$\Delta$Vgs/$\Delta$ log Ids. S is usually measured in millivolts per decade of $\Delta$ log Ids, i.e. mV/decade. For example, a sub-threshold swing S of 100 mV/decade means that a change in Vgs of 100 mV will result in a change in Ids of one decade (10×).

FIG. 2 shows a prior art arrangement of a power amplifier with voltage regulator. The voltage regulator of FIG. 2 comprises a p-channel MOS (202) located on top of a power amplifier PA (250). Regulator transistor (202) regulates the voltage output Vout_reg (206) of the power amplifier (250). Regulator transistor (202) can be in an ON condition—power supply Vdd (208) connected with the power amplifier (250)—or an OFF condition—power supply Vdd (208) disconnected from the power amplifier (250). The voltage signal Vbias (204) biases the regulator transistor (202) into the ON condition or the OFF condition.

In particular, when Vbias (204) increases towards the power supply Vdd (208), regulator transistor (202) starts to turn off, increasing its "on" resistance. As the "on" resistance of regulator transistor (202) increases, its source to drain voltage Vds increases. This causes a decrease in the regulated voltage output Vout_reg (206). The decrease in Vout_reg (206) reduces the amplification of the power amplifier (250). Conversely, when Vbias (204) decreases towards Vref (210), the regulator transistor (202) turns on, reducing its "on" resistance, thereby decreasing its Vds and increasing Vout_reg (206). This results in higher amplification of the power amplifier (250).

When the regulator transistor (202) is biased into the OFF condition, the Vgs of regulator transistor (202) is typically 0V, because the gate input voltage Vbias (204) is set to the power supply Vdd. If the p-channel regulator transistor (202) has a threshold voltage of 0.4V and a sub-threshold swing of 100 mV/decade, then the transistor (202) is passing a subthreshold current Ids at a current value of 4 decades below threshold.

Regulator transistors are typically very wide (in terms of the distance perpendicular to the current flow direction in the transistor), in order to minimize their resistance in the ON state. As an example, it can be assumed that the regulator transistor (202) has a total width of 100 mm and passes current at a rate of 20 mA per millimeter of width at threshold. Then the total current in the OFF condition is 100 mm×20 mA/mm width×1 E−4=200 µA. A leakage current of 200 µA in the OFF condition is a significant battery drain and would be too high for practical use.

SUMMARY

According to a first aspect, an arrangement for reducing leakage current in a regulator transistor for a power amplifier is provided, comprising: a switching arrangement to switch a biasing input of the regulator transistor between a first condition where the regulator transistor is biased by an input voltage to the regulator transistor during an ON state of the regulator transistor and a second condition where the regulator transistor is biased by a leakage current reduction voltage during an OFF state of the regulator transistor, wherein, during the OFF state of the regulator transistor, a sub-threshold biasing voltage of the regulator transistor is controllably distanced from a threshold voltage Vth of the regulator transistor by controlling the leakage current reduction voltage.

According to a second aspect, a leakage current reduction circuit is provided, comprising: (a) a regulator transistor comprising an input adapted to bias the regulator transistor in an ON condition, as soon as an activation voltage reaches a threshold value, or an OFF condition; and (b) switching means connected with the input to connect the input with a first voltage during the ON condition and a second voltage during the OFF condition, wherein, in the OFF condition, a voltage distance between the activation voltage and the threshold value is higher than an absolute value of the threshold value.

According to a third aspect, a voltage generator is provided, comprising: (a) an input adapted to be driven by an input waveform; (b) means to generate, along two distinct paths, complementary waveforms based on the input waveform; (c) a rectifying arrangement to rectify the complementary waveforms to obtain a rectified voltage, switching status of the rectifying arrangement being driven by the complementary waveforms themselves; and (d) means to limit the rectified voltage to a controllable voltage value.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

Figure 1:
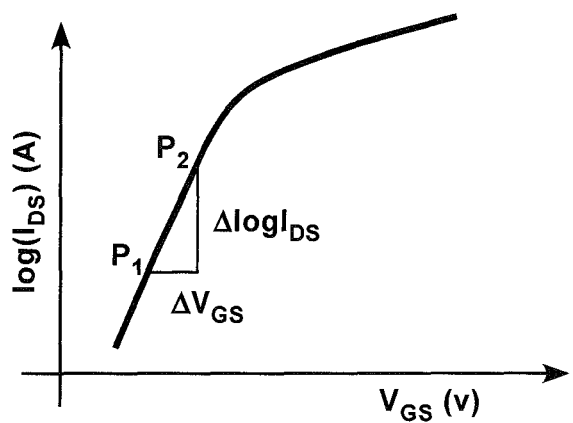
FIG. 1 is a diagram showing log(Ids) as a function of Vgs, in order to define transistor sub-threshold swing.
Figure 2:
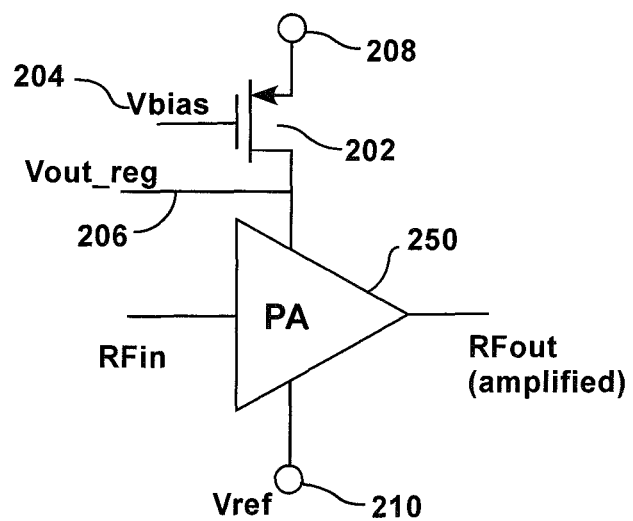
FIG. 2 shows a prior art arrangement of a power amplifier with voltage regulator.
Figure 3:
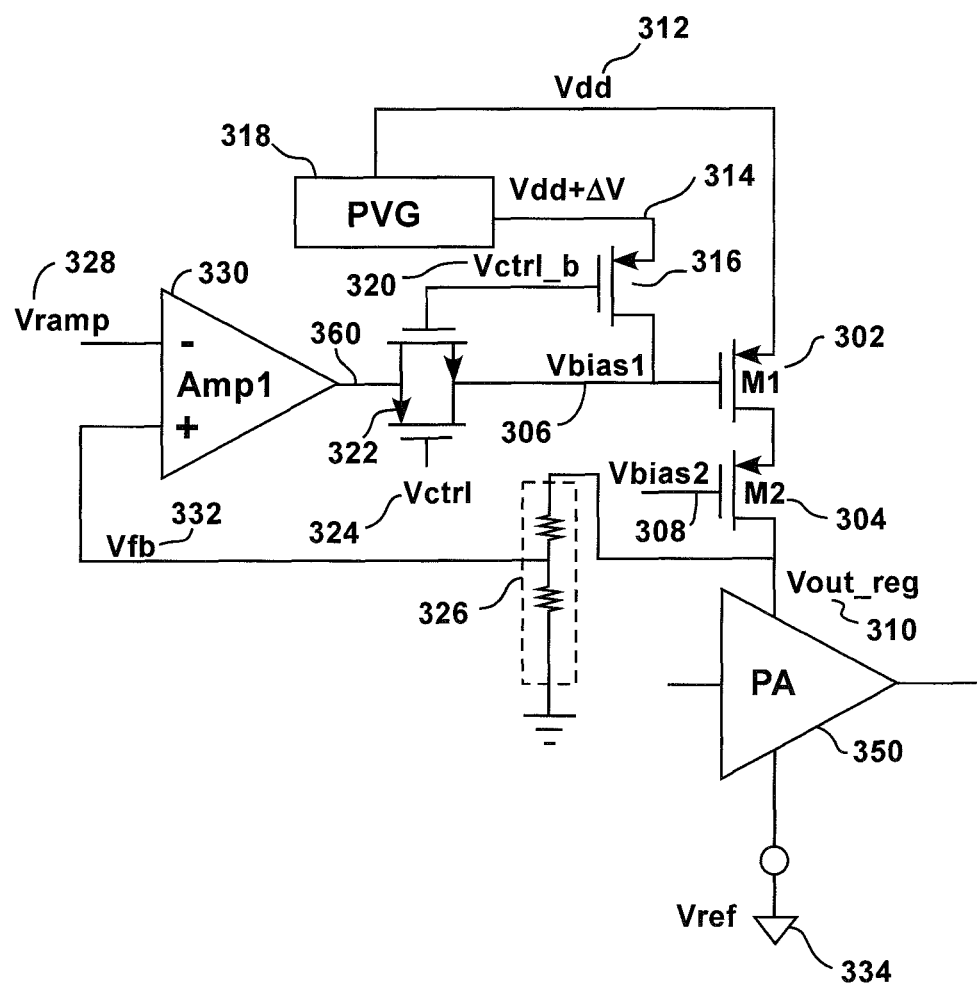
FIG. 3 shows an arrangement of a power amplifier with voltage regulator according to an embodiment of the present disclosure.

FIG. 3 shows a circuital arrangement according to an embodiment of the present disclosure. In particular, FIG. 3 shows a simplified block diagram of a power amplifier PA (350) with regulator transistors M1 (302) and M2 (304). In addition to the power amplifier and regulator transistor shown in FIG. 2, a positive voltage generator block PVG (318) and switching logic (316, 320, 322, 324) are included in the circuit of FIG. 3.

According to the embodiment of FIG. 3, a gate input voltage (306) of a p-channel regulator transistor M1 (302) is provided either by PVG (318) or by the op amp (330). The choice of input to be provided to the regulator transistor M1 (302) is made by a transistor (316) and a pass gate (322). In particular, when the power amplifier PA (350) is biased in an OFF state, the pass gate (322) disconnects the gate input Vbias1 (306) from the output of the op amp (230) and the transistor (316) connects it to the output (314) of the PVG (318).

In the embodiment of FIG. 3, the PVG (318) provides a positive bias Vdd+ΔV that is higher than the power supply Vdd (312). By way of example, ΔV can be selected to be equal to the threshold voltage of M1, e.g., 0.4V. If the PVG output voltage (314) is 0.4V higher than the power supply (312), then the Vgs of the regulator transistor M1 (302) is +0.4V. Given that the regulator transistor M1 (302) comprises a p-channel transistor in the present embodiment, the Vgs values for biasing such transistor in the ON state comprise negative values. Therefore, a +0.4V Vgs value turns off M1 (302) by an additional 0.4V. While this does not affect the OFF status of M1 (302), it advantageously affects its leakage current. In particular, assuming that M1 (302) has a subthreshold swing S=100 mV/decade, the leakage current of M1 (302) is reduced by 4 orders of magnitude. Therefore, such reduction provides the transistor M1 (302) with an acceptable level of leakage during its OFF state. The person skilled in the art of electronics design, and particularly in the power amplifier design arts, will understand, upon review of the present teachings, that the amount of leakage current of M1 can be controlled via the selection of the value ΔV.

The operation of the switching logic (316, 320, 322, 324) is now described in more detail. In particular, two complementary logic control signals, Vctrl (324) and Vctrl_b (320) are provided in order to cause the pass gate (322) to switch. In the embodiment of FIG. 3, the pass or transmission gate (322) comprises a combination of an n-channel MOS transistor (upper transistor in FIG. 3) and a p-channel MOS transistor (lower transistor in FIG. 3). The control voltages Vctrl (324) and Vctrl_b (320) are provided by circuitry not shown in this figure using means well known to those skilled in the circuit design arts. Vctrl (324) is typically allowed to vary in value from supply voltage Vdd (312) to a value near Vdd/2. Vctrl_b (320) varies in a complementary or opposite manner to Vctrl (324).

Therefore, when Vctrl (324) is in digital "high" state (for example, when it is equal to Vdd (312)), Vctrl_b (320) is lower and close to Vdd/2 in this particular implementation. In contrast, when Vctrl (324) is in a digital "low" state (for example, close to Vdd/2), then Vctrl_b (320) is high.

When it is desired to operate the power amplifier (350) in the OFF state, the digital control voltage Vctrl (324) is provided to the gate of the p-channel transistor of the pass gate (322) in the high state. When Vctrl (324) is in the high state, it turns off the p-channel transistor of the pass gate (322). At the same time, Vctrl_b (320), which is low, turns off the n-channel transistor of the pass gate (322) and turns on the p-channel transistor (316). In this state, the pass gate (322) disconnects the gate input Vbias1 (306) from the output of the op amp (330), and Vbias1 (306) is coupled to the output (314) of the PVG (318) through the transistor (316). As described above, this condition turns off the regulator transistor M1 (302), thereby disconnecting the power supply Vdd (312) from the power amplifier (350).

When the power amplifier (350) is desired to operate in the ON state, the digital control voltage Vctrl (324) is provided to the gate of the p-channel transistor of the pass gate (322) in the low state. When Vctrl (324) is in the low state, it turns on the p-channel transistor of the pass gate (322). At the same time, Vctrl_b (320), which is high, turns on the n-channel transistor of the pass gate (322) and turns off the p-channel transistor (316). In this state, the pass gate (322) connects the gate input Vbias1 (306) to the output of the op amp (330), and Vbias1 (306) is disconnected from the output (314) of the PVG (318). The output of the op amp (330) is indicative of the difference between a signal Vfb (332) and a signal Vramp (328). The signal Vfb (332) is indicative of the regulated voltage Vout_reg (310) as shown by the feedback path connecting Vout_reg (310) to Vfb (332) through voltage divider (326).

Therefore, Vfb (332) is a scaled version of Vout_reg (310) set by sizing the resistors in the voltage divider (326). The op amp (330) compares Vramp (328) to Vfb (332) and drives Vbias1 (306) such that regulator transistor M1 (302) drops a voltage level below Vdd (312) to properly set Vout_reg (310). The maximum output power level occurs when Vout_reg approaches Vdd. A typical range for the Vramp (328) control signal is 0.1-1.75V and the typical battery voltage Vdd is 3.5V. Therefore, the regulator loop can be designed such that the ratio between Vout_reg and Vramp is 3.5/1.75 or 2, set by the resistive divider (326).

Due to reliability constraints, semiconductor processes typically have a specified maximum voltage that is allowed to exist from a source to drain across a transistor ("Max Vds"). When the difference in potential between power supply (e.g., battery supply) Vdd (312) and Vref (334) is less than the Max Vds of the regulator transistor (302), a single transistor M1 (302) is sufficient to prevent violation of the this Max Vds rule in the regulator block.

Therefore, in one embodiment, the regulator transistor M2 (304) is replaced with a direct electrical connection disposed between the drain of the regulator transistor M1 (302) and Vout_reg (310). In such an embodiment, when the regulator transistor M1 (302) is biased in the OFF condition, the entire potential Vdd−Vref is applied as the Vds across that transistor.

In another embodiment, when the difference in potential between the power supply Vdd (312) and Vref (334) exceeds Max Vds of the transistor M1 (302), the regulator transistor M2 (304) can be coupled as shown in FIG. 3 between the drain of the regulator transistor M1 (302) and the Vout_reg (310). The gate input Vbias2 (308) of the regulator transistor M2 (304) is, in one embodiment, equal to half of the power supply Vdd. When Vbias2 (308) equals half of the power supply Vdd and the regulator transistor M1 (302) is biased in the OFF condition, the power supply voltage Vdd is shared equally across the regulator transistors M1 (302) and M2 (304), thereby doubling the maximum power supply that the regulator transistors can reliably handle. As one of ordinary skill in the art of electronic circuit design will appreciate, additional regulator transistors can be coupled in series to further increase the voltage handling capability of the regulator.

While the embodiment of FIG. 3 shows the regulator transistors as comprising p-channel MOS transistors, persons skilled in the electronics design arts will appreciate that the concepts set forth in the present disclosure are applicable to circuits having regulator transistors comprising other electronic devices, e.g., comprising n-channel MOS transistors. Such additional embodiment will be explained with reference to FIG. 5 and FIG. 6, later discussed. For example, in FIG. 5, the output (514) of a negative voltage generator NVG (518) is Vref−ΔV, thus further biasing M2 in the OFF condition, given that in this example its Vgs is equal to −ΔV.

Figure 4:
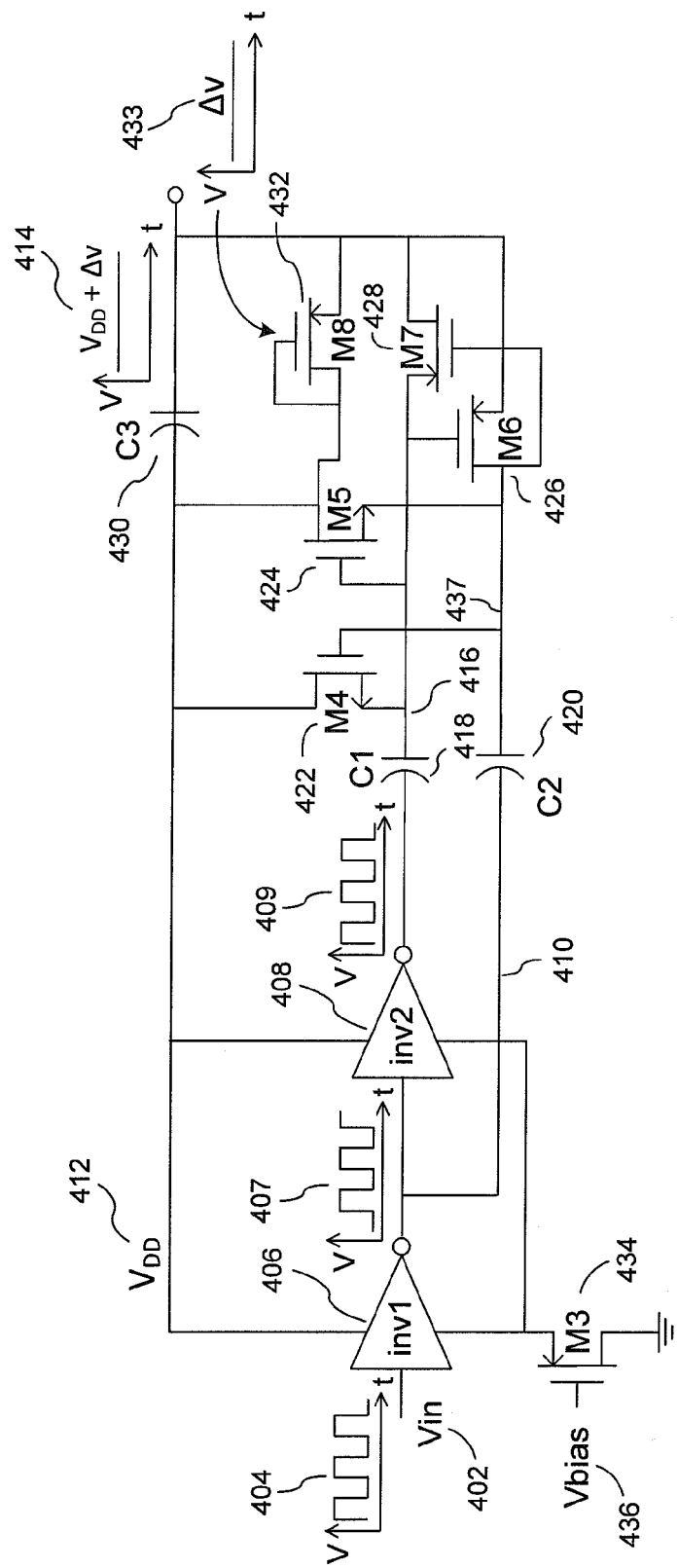
FIG. 4 shows one embodiment of the positive voltage generator (PVG) described in FIG. 3.

FIG. 4 shows one embodiment of the positive voltage generator (PVG) described above with reference to FIG. 3. As shown in FIG. 4, the input Vin (402) of the PVG is driven by a low power square waveform (404) generator. Inverters Inv1 (406) and Inv2 (408) generate complementary waveforms along respective circuit paths (410), (416). Specifically, a waveform (407) output from the inverter Inv1 (406) is complementary to a waveform (409) output from the inverter Inv2 (408). The voltage across inverters Inv1 (406) and Inv2 (408) may be limited by p-channel MOS transistor M3 (434) and its gate input signal Vbias3 (436), in order to avoid violating the "Max Vds" limit on Inv1 (406) and Inv2 (408). A further current adjustment of the PVG can be obtained by adjusting the frequency of the input waveform (404).

Each waveform is coupled, along the paths (416) and (410), through respective capacitors C1 (418) and C2 (420), to a rectifying arrangement including switching transistors M4 through M7 (422, 424, 426 and 428). In accordance with the embodiment shown in FIG. 4, the gates of the switching transistors are driven by the coupled waveforms themselves in order to perform the switching action, and are therefore driven without need for a separate gate drive for the switches. In particular, according to the embodiment shown in FIG. 4, the switch M4 comprises an n-channel MOS transistor that couples the signal Vdd (412) to path (416) when the signal on path (410) is a logic "high". The switch M5 comprises an n-channel MOS transistor that couples the signal Vdd (412) to the path (437) when the signal on path (416) is a logic "high". The switch M6 comprises a p-channel MOS transistor that allows the signal on the path (437) to be transmitted to the output when the signal on the path (416) is a logic "low". The switch M7 comprises a p-channel MOS transistor that allows the signal on the path (416) to be transmitted to the output when the signal on path (410) is a logic "low".

As shown in FIG. 4, the rectified voltage output (414) (see the voltage output (314) described above and shown in FIG. 3) is stored and filtered by capacitor C3 (430). A diode connected transistor M8 (432) acts as a voltage limiter that limits the output of the PVG to the supply (e.g., battery) voltage (433) Vdd +one Vds=Vgs=ΔV that is approximately equal to the threshold voltage of device M8 (432). The value ΔV (433) is controllable. For example, different values of ΔV (433) may be obtained by varying the devices used to implement the transistor M8 (432).

The combined switching and driving arrangement shown in FIG. 4 results in a single supply voltage Vdd across any of the devices. This feature facilitates the use of single devices (i.e., there is no need of stacked—connected in series—devices to handle a higher Vds voltage) in the charge pump circuit of FIG. 4, thus increasing efficiency and decreasing current consumption. For example, if two devices in series had to be used for each switch in the charge pump to handle the excessive Vds voltage, the gate capacitance of the switches would increase due to larger devices needed for the same switch resistance (as obtained when using only one device). Larger gate capacitance would result in larger driving current, thus decreasing the efficiency of the charge pump.

According to a practically implemented embodiment of the charge pump, the charge pump had a current consumption of 0.25 μA operating at several hundred Kilohertz.

As already noted above, the embodiment of FIG. 5 shows a negative voltage generator NVG (518) and n-channel MOS transistors M1 (502) and M2 (504). The operation of the embodiment of FIG. 5 will be briefly explained below. The person skilled in the art will understand that the structure and the operation can be also understood from the description of the PVG and p-channel MOS embodiment described above with reference to FIG. 3.

Figure 5:
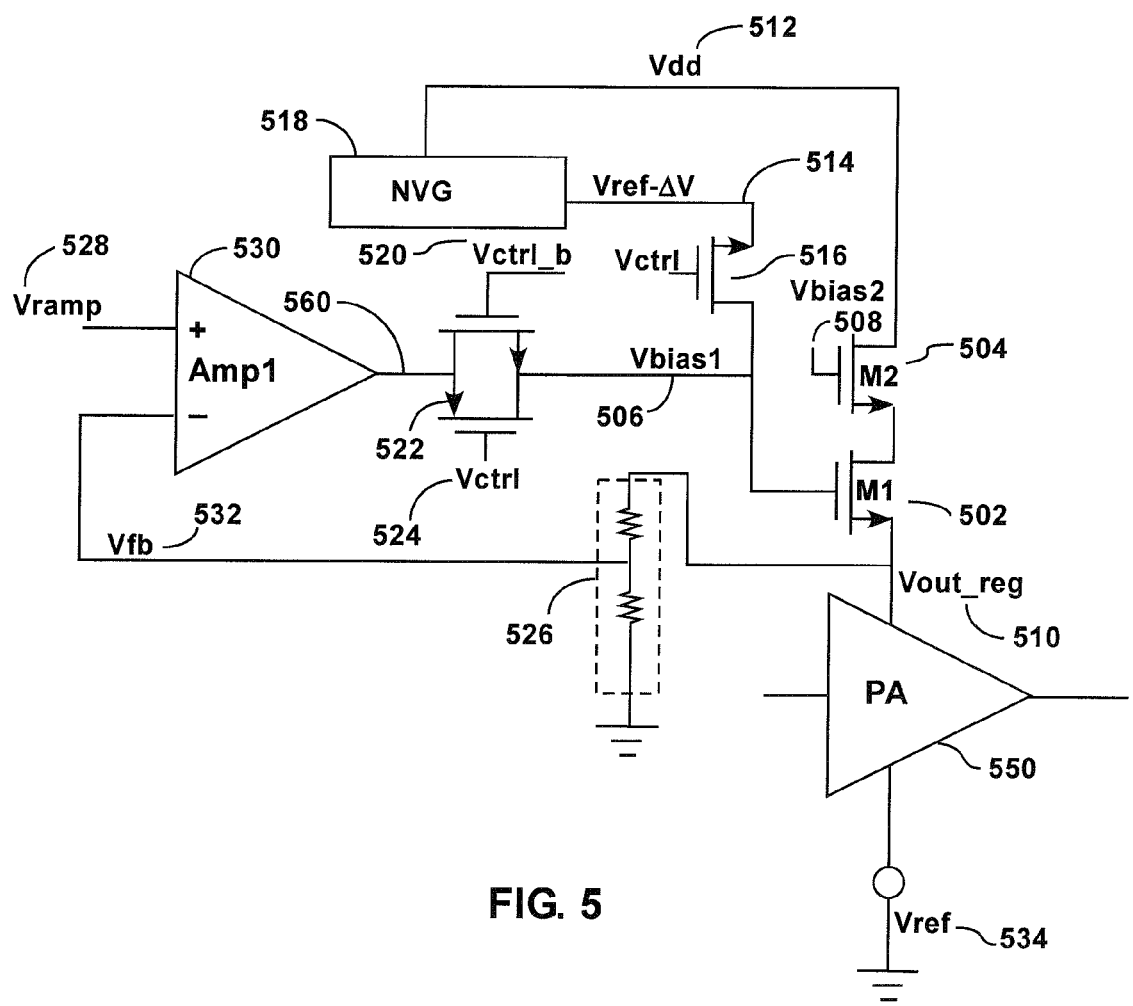
FIG. 5 shows a further arrangement of a power amplifier with voltage regulator according to a further embodiment of the present disclosure.

As shown in FIG. 5, NVG (518) generates a voltage (514) equal to Vref−ΔV that is lower than the reference voltage Vref. By way of example, ΔV can be selected to equal to the threshold voltage of M1B, e.g., 0.4V.

Similarly to what explained with reference to FIG. 3, switching arrangement A of FIG. 5 disconnects the steering op amp (530) during a power down condition and switching arrangement B of FIG. 5 connects the NVG voltage (514) to the gate of the pass device M1 (502) of the regulator of FIG. 5.

Also in the embodiment of FIG. 5, similarly to what shown in the embodiment of FIG. 3, Vbias2 (508) can be adjusted to provide equal voltage division between devices M1 (502) and M2 (504).

Should Vout_reg (510) be adjusted to close to Vdd, the voltage output of op amp (530) should be above Vdd.

Figure 6:
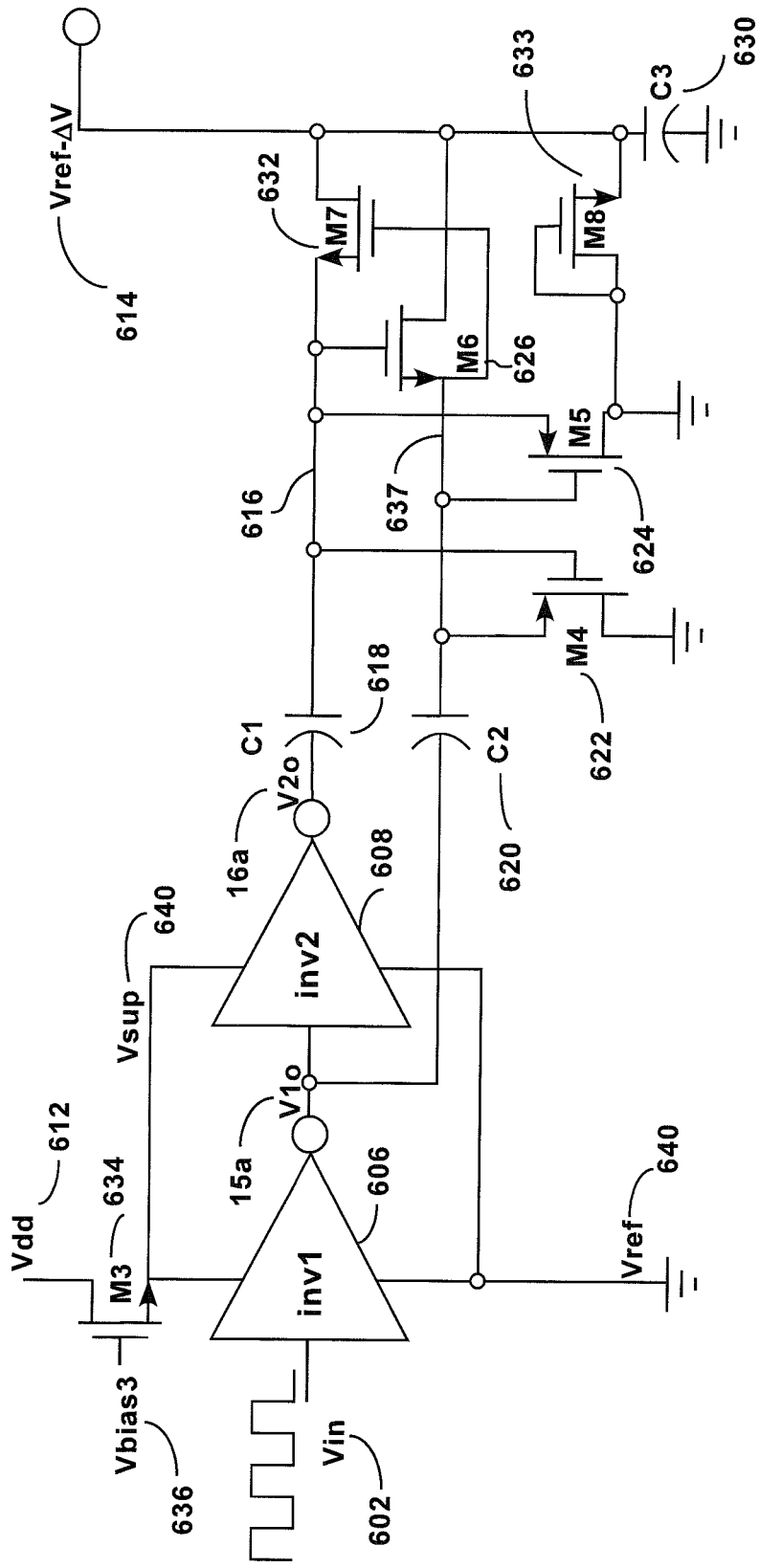
FIG. 6 shows one embodiment of the negative voltage generator (NVG) described in FIG. 5.

Similarly to what shown in FIG. 4, FIG. 6 shows one embodiment of the negative voltage generator (NVG) described above with reference to FIG. 5. Also in this case, the person skilled in the art will understand that the structure and operation of the NVG of FIG. 6 can be understood from the description of the PVG provided in FIG. 4.

Inverters Inv1 (606), Inv2 (608), capacitors C1 (618), C2 (620), and transistors M4 (622) and M5 (624) act as level shifters that output complementary square waveforms at nodes (616) and (637) of value Vref to Vref–Vsup. This waveform is rectified by switches M7 (632) and M6 (626) that are self driven from the same waveforms but opposite phases. Transistor M8 (633) acts as a negative voltage limiter and capacitor C3 (630) performs a storage and filtering function. Transistor M3 (634) together with its gate input Vbias3 (636) limits the Vsup voltage in order to avoid violating the "max Vds" limit on Inv1 (606) and Inv2 (608).

The devices according to the present disclosure can also be used, by way of example, with power amplifiers present in amplitude modulators, such as those found in EDGE type GSM radios.

Accordingly, what has been shown are devices and methods for leakage current reduction in a power regulator. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein A number of embodiments of the present inventive concept have been described. Nevertheless, it will be understood that various modifications may be made without departing from the scope of the inventive teachings. For example, also integrated CMOS regulators can be used with the inventive concepts taught in the present disclosure, both in the PVG and NVG embodiments.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A voltage generator comprising:
   (a) an input adapted to be driven by an input waveform;
   (b) means to generate, along two distinct paths, complementary waveforms based on the input waveform;
   (c) a rectifying arrangement to rectify the complementary waveforms to obtain a rectified voltage, switching status of the rectifying arrangement being driven by the complementary waveforms themselves; and
   (d) means to limit the rectified voltage to a controllable voltage value.

2. The voltage generator of claim 1, the voltage generator being for reducing leakage current in a regulator transistor.

3. The voltage generator of claim 2, the voltage generator being connected with a voltage supply and outputting a leakage current reduction voltage.

4. The voltage generator of claim 1, wherein the means to generate the complementary waveforms comprise a first inverter and a second inverter.

5. The voltage generator of claim 4, further comprising:
   voltage limiting means to limit the voltage across the first inverter and the second inverter.

6. The voltage generator of claim 1, further comprising current adjusting means to adjust current throughput through the voltage generator.

7. The voltage generator of claim 1, wherein the rectifying arrangement comprises switching capacitors and switching transistors.

8. The voltage generator of claim 1, wherein the means to limit the rectified voltage to a controllable voltage value comprise a transistor acting as a voltage limiter.

9. The voltage generator of claim 1, said voltage generator being a positive voltage generator.

10. The voltage generator of claim 1, said voltage generator being a negative voltage generator.

* * * * *